US008467739B2

(12) United States Patent
Vajha et al.

(10) Patent No.: US 8,467,739 B2
(45) Date of Patent: Jun. 18, 2013

(54) MONOLITHIC INTEGRATED TRANSCEIVER

(76) Inventors: Sasidhar Vajha, Brooklyn Park, MN (US); Timothy T. Childs, Minnetonka, MN (US); Daniel C. Eller, Silver Lake, MN (US)

(*) Notice: Subject to any disclaimer, the term of this patent is extended or adjusted under 35 U.S.C. 154(b) by 1223 days.

(21) Appl. No.: 12/208,198

(22) Filed: Sep. 10, 2008

(65) Prior Publication Data

US 2009/0111394 A1    Apr. 30, 2009

Related U.S. Application Data

(63) Continuation of application No. PCT/US2007/006232, filed on Mar. 12, 2007.

(60) Provisional application No. 60/781,470, filed on Mar. 10, 2006.

(51) Int. Cl.
*H04B 1/40* (2006.01)

(52) U.S. Cl.
USPC .............. 455/75; 455/76; 455/84; 331/107 R

(58) Field of Classification Search
USPC ................... 455/75, 76, 84; 331/107
See application file for complete search history.

(56) References Cited

U.S. PATENT DOCUMENTS

| 5,805,871 | A  | * | 9/1998 | Baxter ........................... 713/500 |
| 6,078,223 | A  | * | 6/2000 | Romanofsky et al. ............. 331/9 |
| 6,208,214 | B1 |   | 3/2001 | Geddes et al. |
| 6,252,469 | B1 |   | 6/2001 | Suematsu |
| 7,068,115 | B2 |   | 6/2006 | Austin et al. |
| 7,088,971 | B2 |   | 8/2006 | Burgener et al. |
| 7,146,136 | B2 |   | 12/2006 | Consolazio |
| 7,248,120 | B2 |   | 7/2007 | Burgener et al. |
| 2007/0040735 | A1 | * | 2/2007 | Matsuo et al. ................ 342/175 |

FOREIGN PATENT DOCUMENTS

| JP | 2003273752 | 9/2003 |
| JP | 2008-558440 | 7/2012 |
| WO | WO 2006002347 A1 | 1/2006 |

* cited by examiner

*Primary Examiner* — Wen Huang

(57) ABSTRACT

A variable operational mode transceiver device formed with an integrated circuit having a semiconductor material substrate supporting a feedback oscillator having a signal power divider electrically coupled to said feedback oscillator output, and a signal frequency multiplier electrically coupled to said signal power divider. A signal mixer has a pair of inputs of which one is electrically coupled to that remaining one of said pair of outputs of said signal power divider.

20 Claims, 10 Drawing Sheets

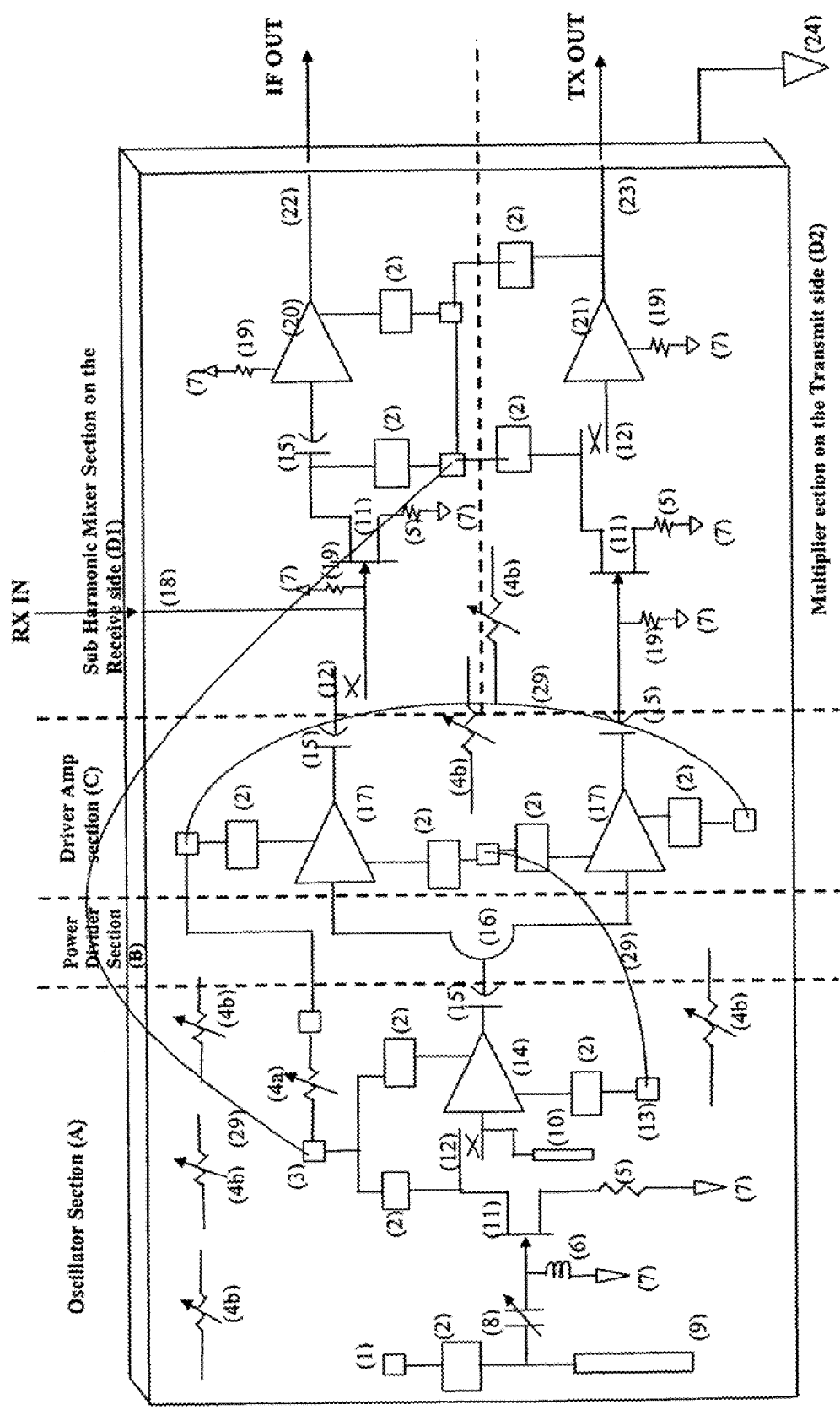
Fig. 1a: Functional drawing of the fully integrated MINT chip FMCW/Pulse Version (no IFin)

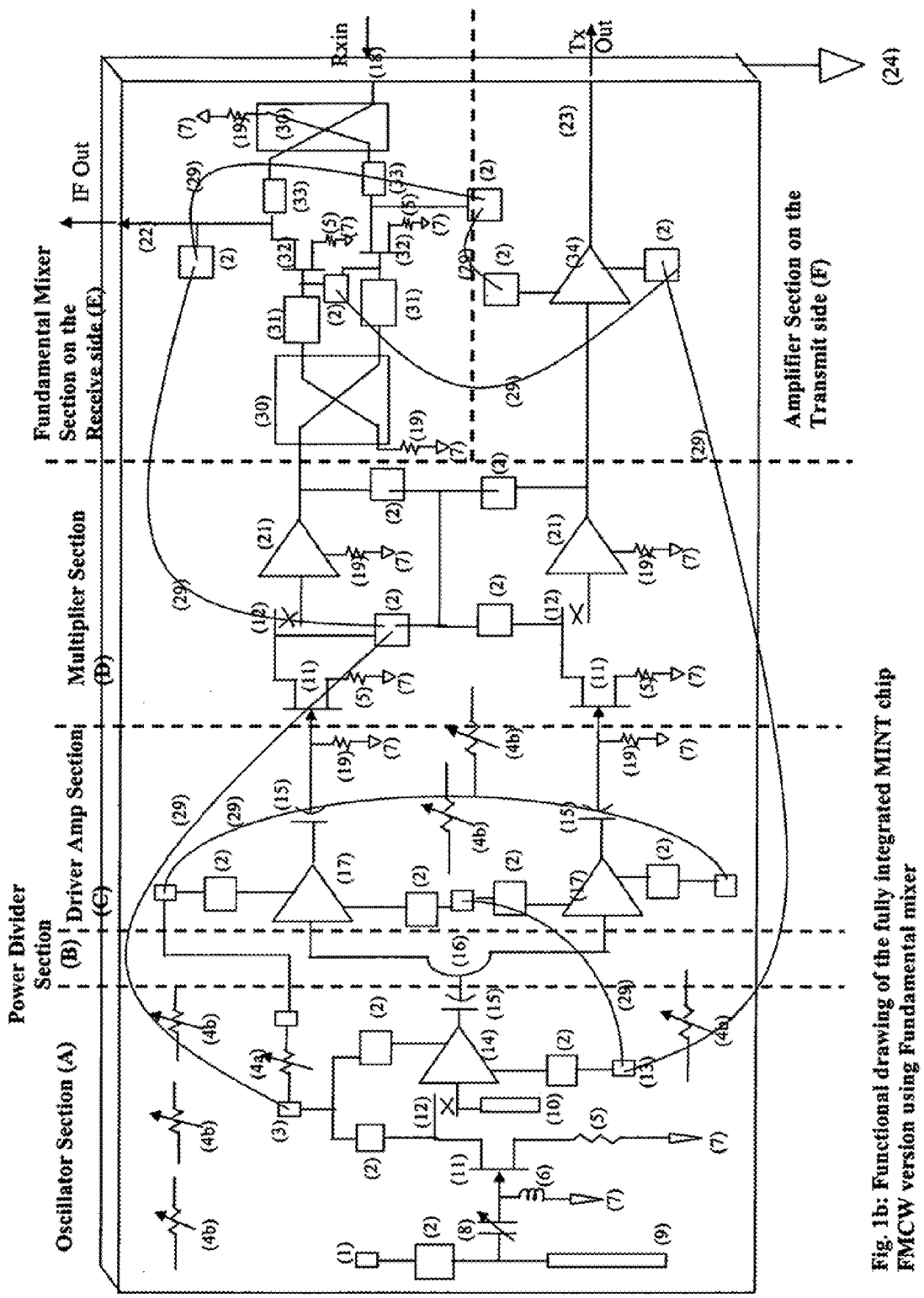
Fig. 1b: Functional drawing of the fully integrated MINT chip FMCW version using Fundamental mixer

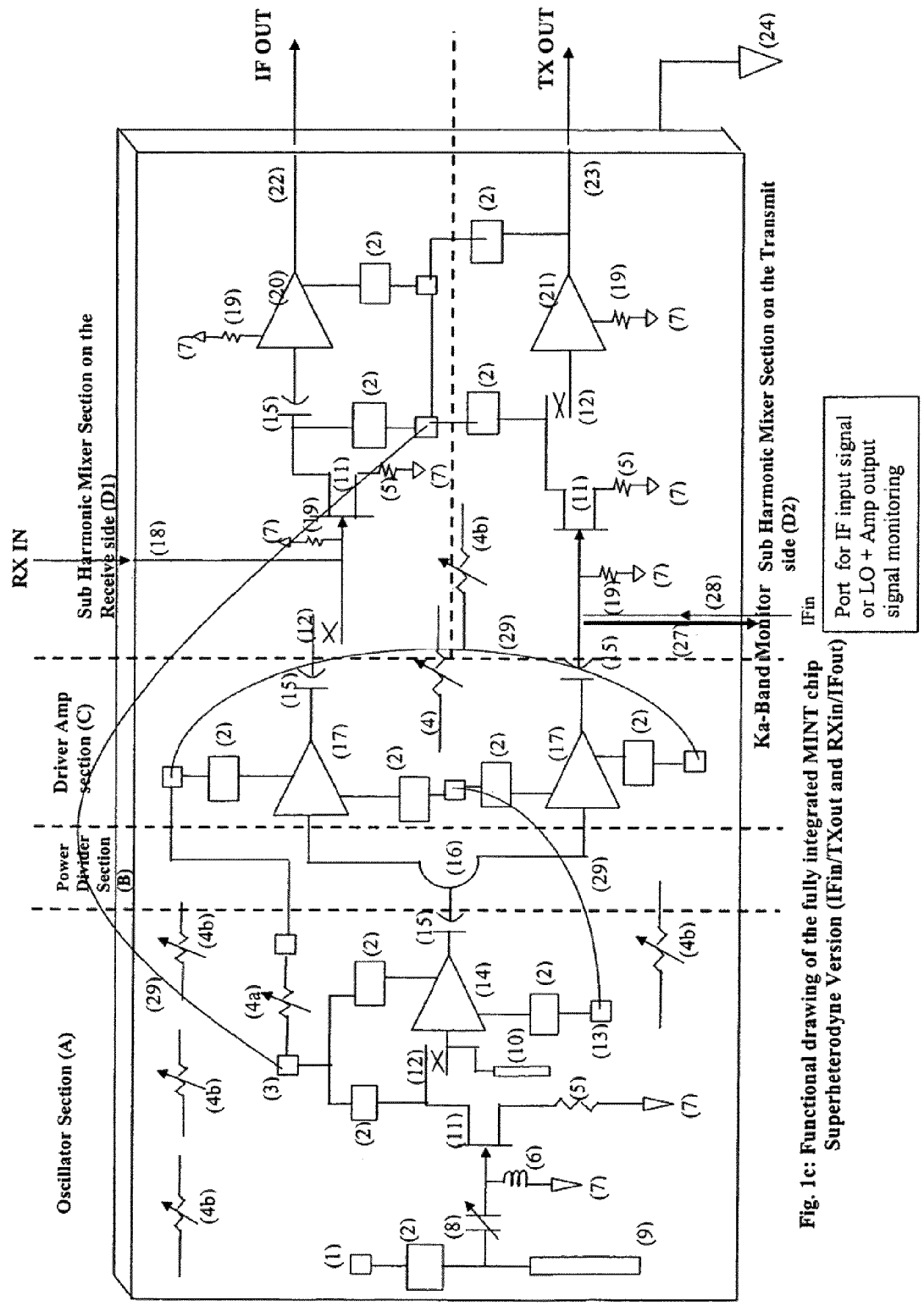
Fig. 1c: Functional drawing of the fully integrated MINT chip Superheterodyne Version (IFin/TXout and RXin/IFout)

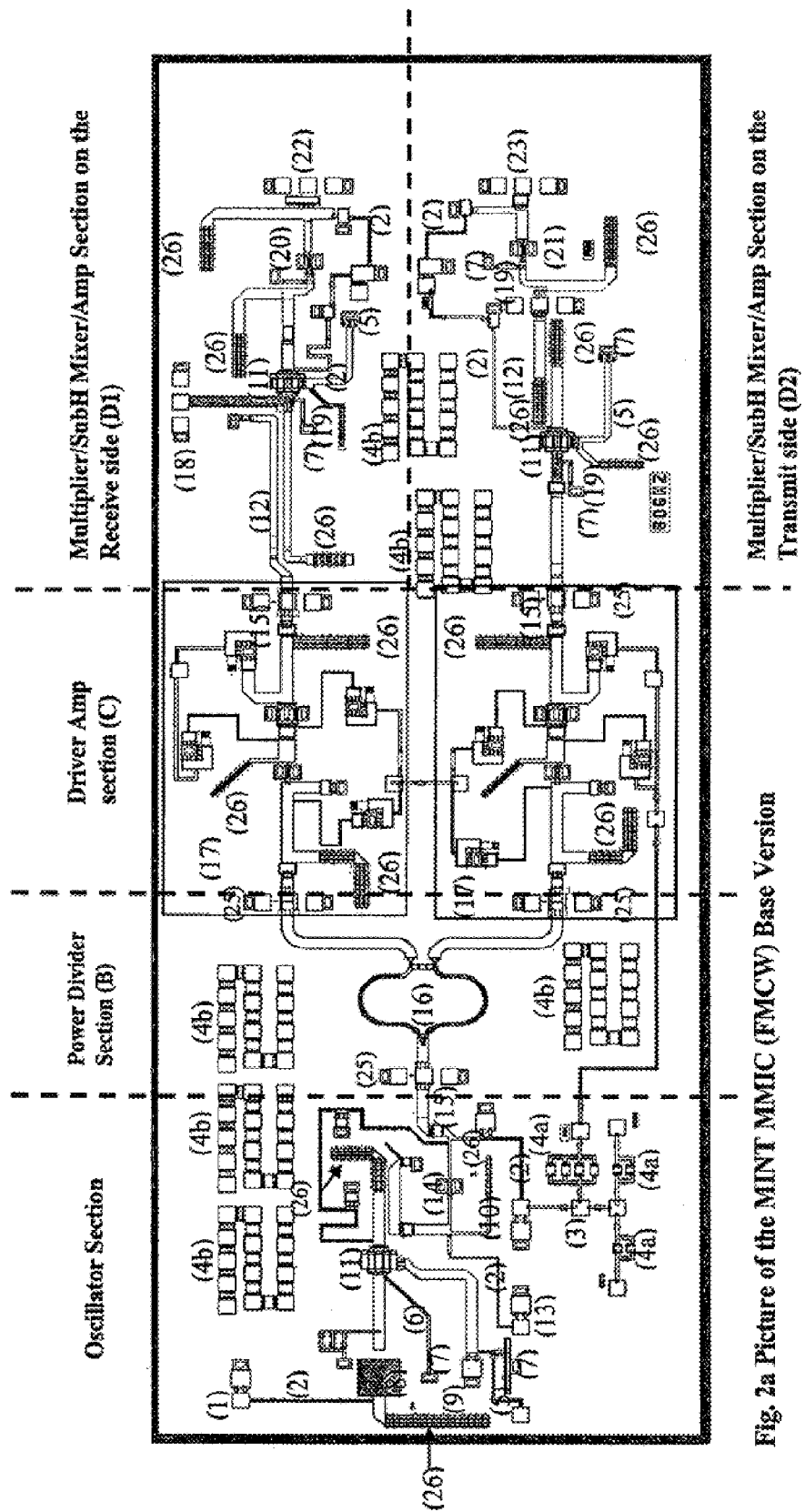
Fig. 2a Picture of the MINT MMIC (FMCW) Base Version

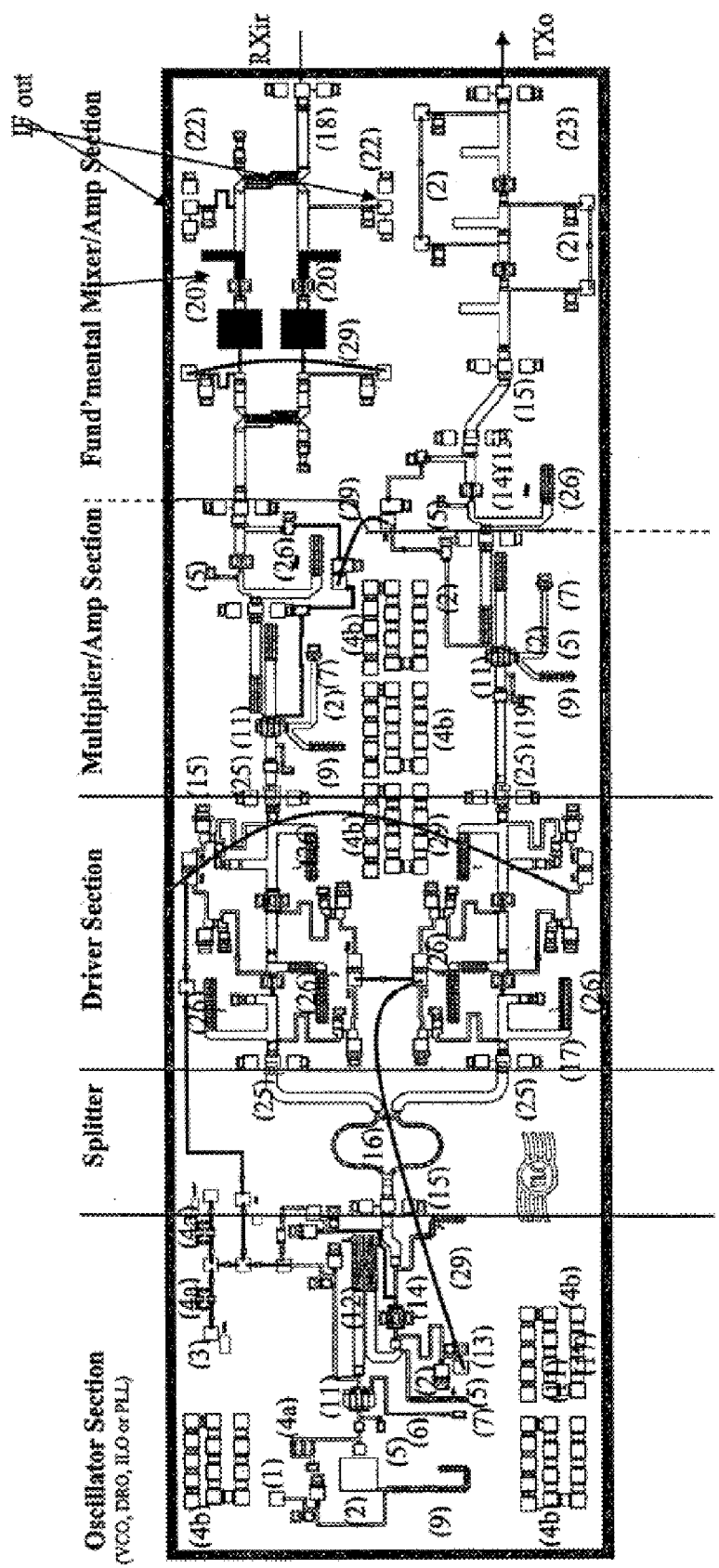
Figure 2b: TLC's MINT Chip with Fundamental V to W-Band Mixer on the Rx
And Fundamental V to W-Band power Amp on the TX.

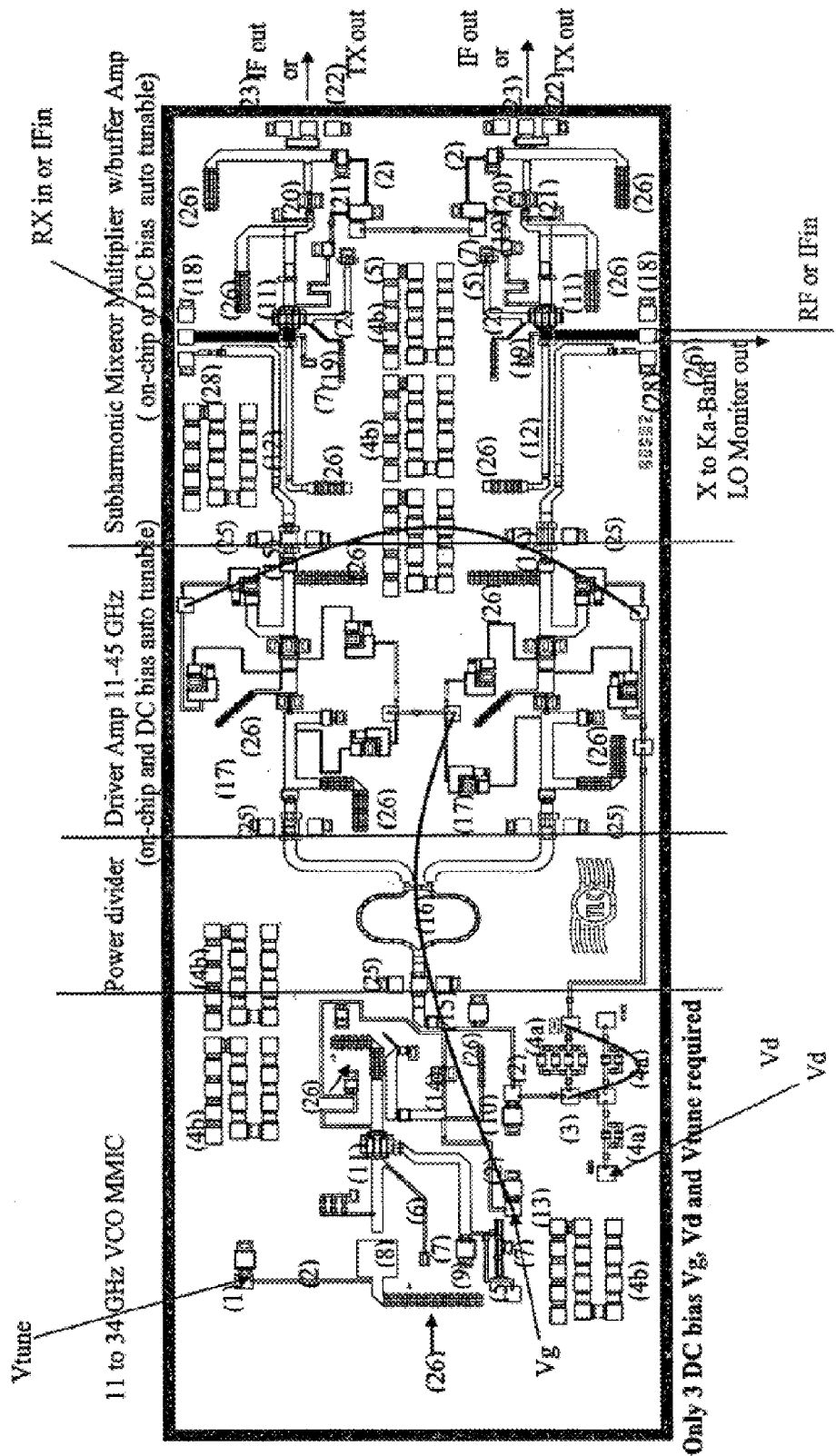
Figure 2c: TLC's 11 to 100+ GHz Superheterodyne MINT Chip Layout

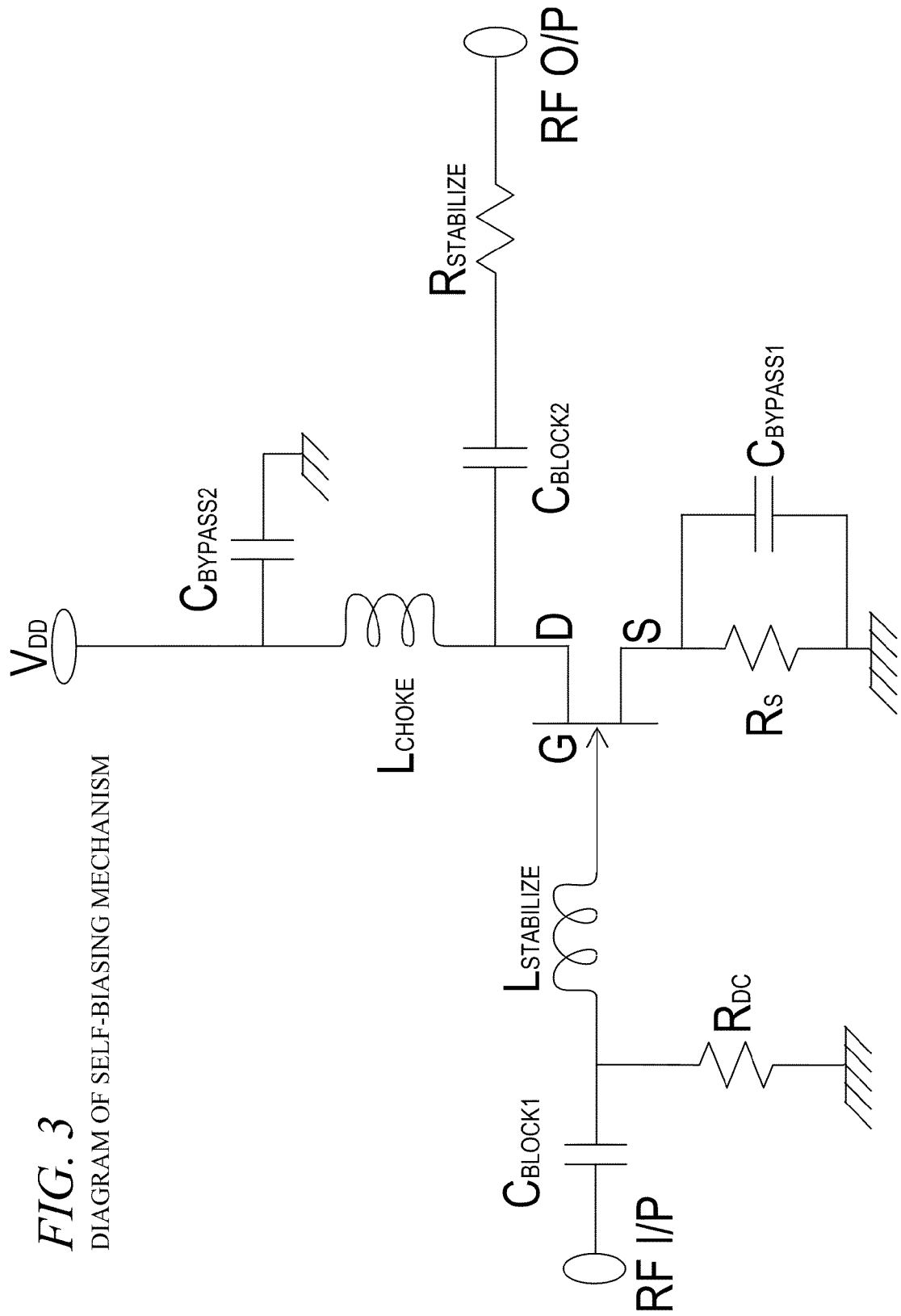
*FIG. 3* DIAGRAM OF SELF-BIASING MECHANISM

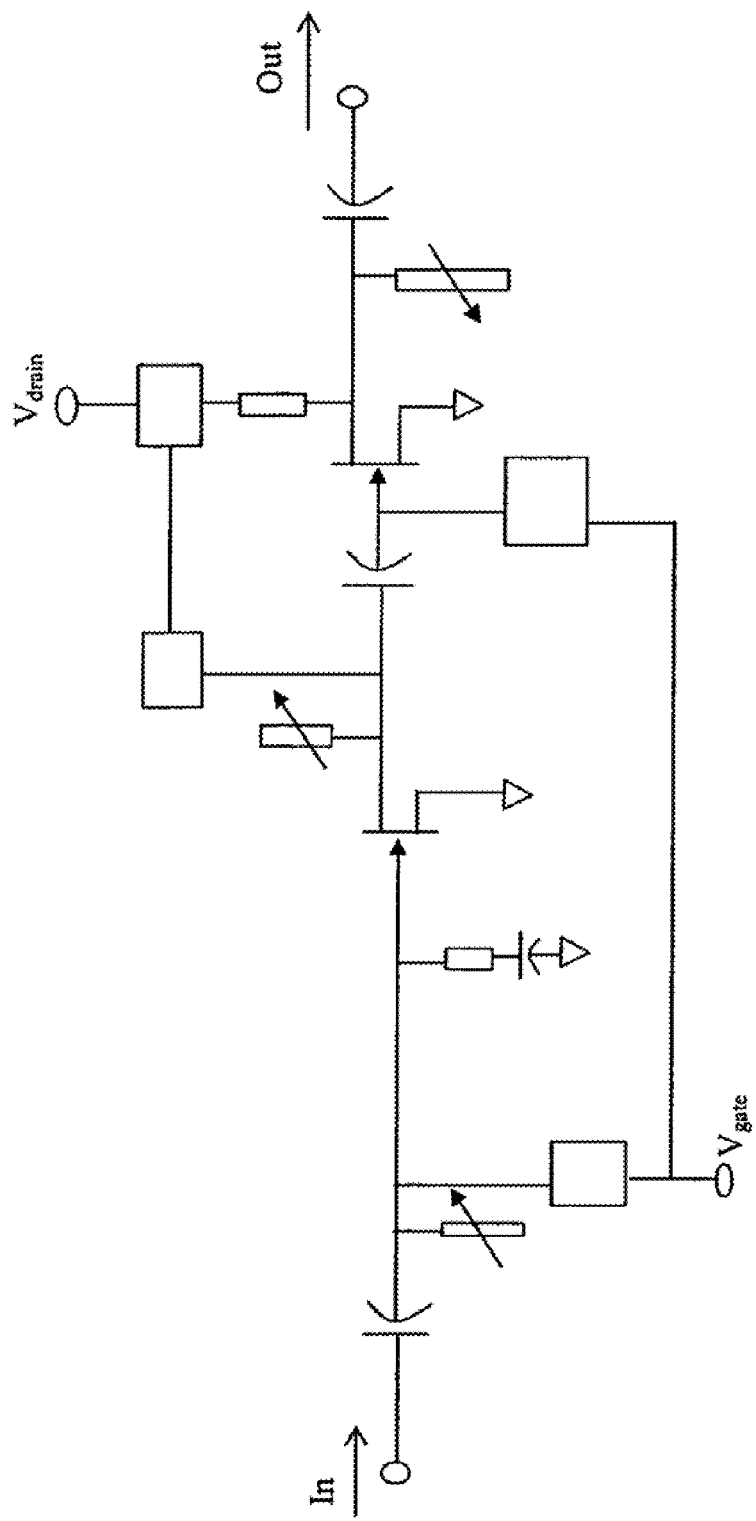
Fig. 4 Driver Amplifier Circuit with Frequency and VSWR Air Bridge Tuning Stubs

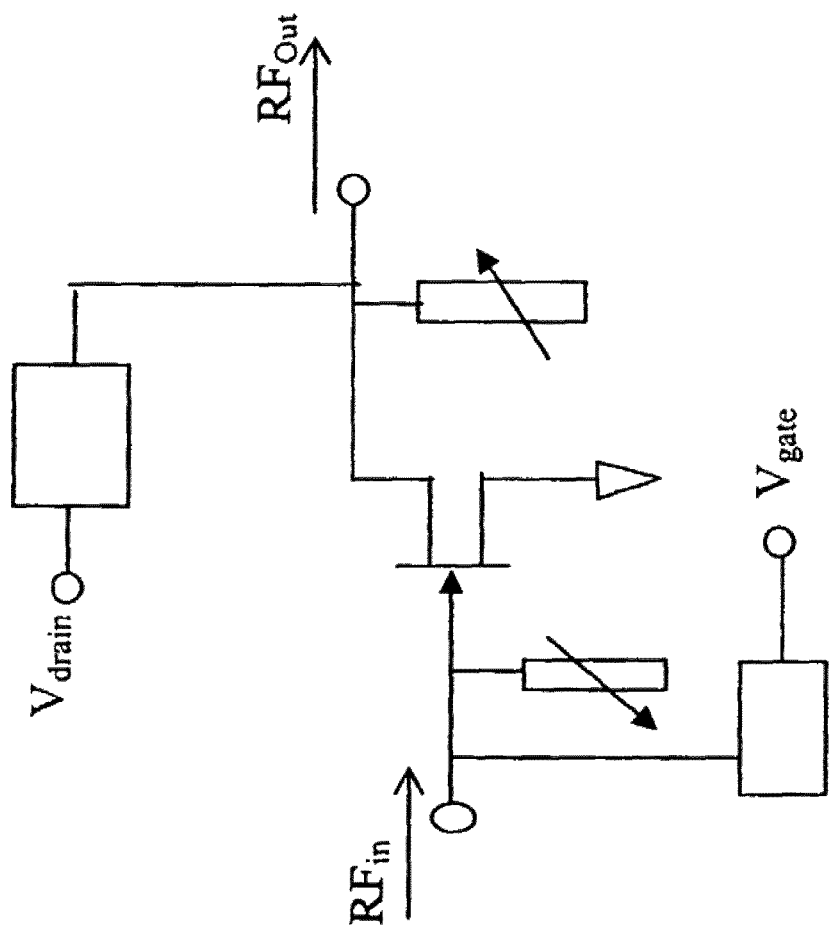
Fig. 5 Buffer Amplifier

Figure 6: Single transceiver with RF signal recognition for remote conversion for FMCW or Superheterodyne Operation.

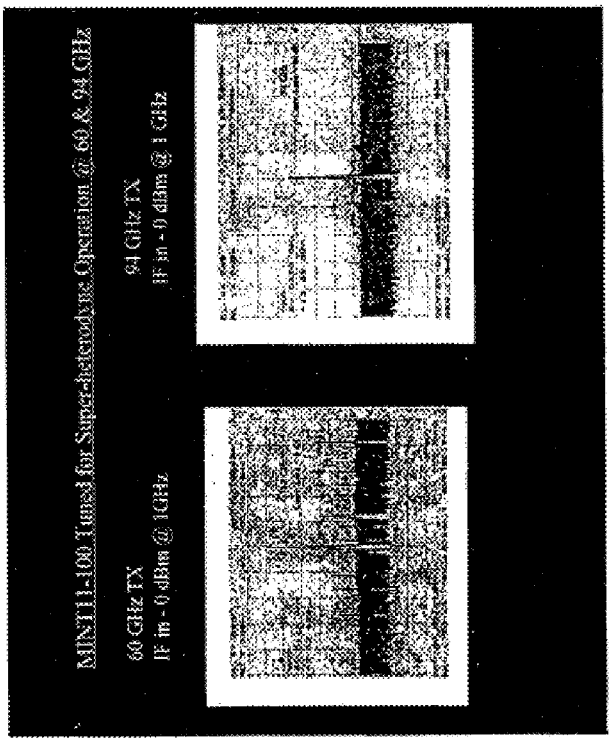

Figure 6B: the same Single Transceiver MMIC in Superheterodyne mode. The onchip LO set at 59 GHz and 93 GHz with Input IF signal at 1 GHz for each LO setting

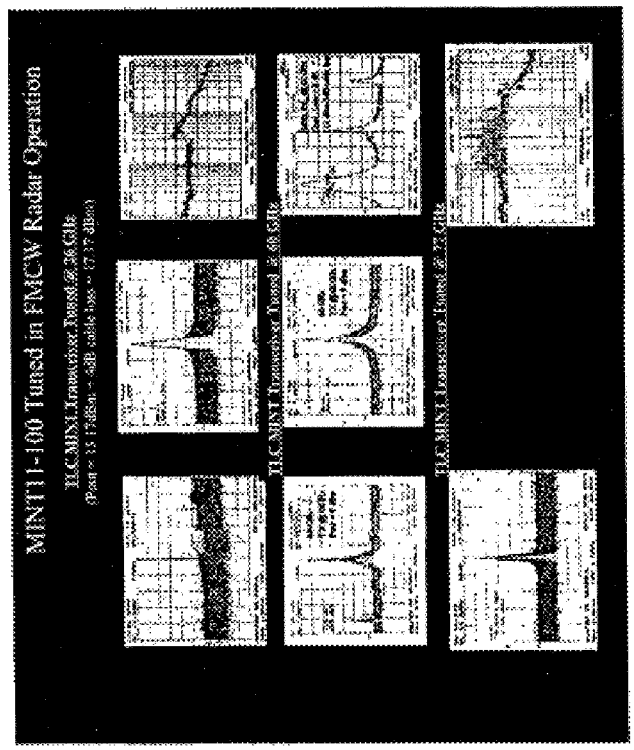

Figure 6 a : Single transceiver MMIC in FMCW Radar mode. Transmit test at 26 GHz, 60 GHz and 77 GHz, Receive test@60 GHz.

MONOLITHIC INTEGRATED TRANSCEIVER

CROSS-REFERENCE TO RELATED APPLICATIONS

This application is a continuation of International Patent Application No. PCT/US2007/006232 (WO 2007/106443) filed Mar. 12, 2007, which claimed priority from U.S. Provisional Patent Application No. 60/781,470 filed Mar. 10, 2006, which applications are both hereby incorporated by reference in their entirety.

STATEMENT REGARDING FEDERALLY SPONSORED RESEARCH OR DEVELOPMENT

This invention was made with Government support under SBIR Contract #F29601-03-C-0029 awarded by the United States Air Force. The Government has certain rights in the invention.

BACKGROUND OF THE INVENTION

The present invention relates to high frequency signal processing circuits and, more particularly, to high frequency signal processing circuits provided in monolithic integrated circuit chips.

Current and future millimeter wave commercial and military communication systems require high performance transceivers with reduced size, weight, reconfigurability, versatility and low cost. Monolithic microwave integrated chip (MMIC) technology was a major breakthrough in reducing the individual component sizes, flexibility and versatility. In typical transceivers currently available, several individual MMICs are assembled via epoxy or solder, and wire bonding, with individual passive components (resistors, capacitors, etc.) into a package to realize its operating circuits and components which assemblies in turn are relatively costly and bulky. Thus, there is a desire for smaller, less expensive, transceivers for use in communication, tracing, sensor, and security systems including, but not limited to, phased array radars, automotive collision avoidance, airport surveillance, image radar, wireless uplink and downlink communication, etc.

BRIEF SUMMARY OF THE INVENTION

The present invention provides a variable operational mode transceiver device formed with an integrated circuit having a semiconductor material substrate with a conductive ground plane on an equipotential major surface thereof on a side opposite an operating major surface thereof. A feedback oscillator is supported on said substrate at said operating major surface has an output with an output impedance and formed from an amplifier having a directional coupler in a feedback arrangement between said feedback oscillator output and said feedback oscillator input. A signal power divider, supported on said substrate at said operating major surface, has an input with an input impedance electrically and is electrically coupled to said feedback oscillator output, and also has a pair of outputs each with an output impedance. A signal frequency multiplier, supported on said substrate at said operating major surface, has an input with an input impedance and is electrically coupled to one of said pair of outputs of said signal power divider. A signal mixer, supported on said substrate at said operating major surface, has a pair of inputs each with an input impedance of which one is electrically coupled to that remaining one of said pair of outputs of said signal power divider.

BRIEF DESCRIPTION OF THE DRAWINGS

FIGS. 1a, 1b, and 1c show mixed schematic and block diagrams of circuits embodying the present invention.

FIGS. 2a, 2b, and 2c show-top view layouts of the monolithic integrated circuit chips embodying the present invention.

FIGS. 3, 4, and 5 show schematic diagrams of portions of the circuits of the present invention.

FIGS. 6a and 6b show graphs with plots of data taken with respect to a single transceiver chip at different frequencies and in different modes of operation.

DETAILED DESCRIPTION OF THE INVENTION

A transceiver that can be fabricated in a single monolithic integrated circuit can eliminate the need for time-consuming epoxy/solder and wire bonding assembly of multiple components, and reduce the need for external passive components and relatively expensive transceiver modules housings. The monolithic integrated circuit chips described below can operate over signal frequencies from 11 GHz, or intermediate X-Band, to 100 GHz, or W-Band, and includes allowing selection of the kind of circuit operation system to be used from among continuous wave frequency modulation, pulse and superheterodyne transceiver systems through suitably selecting, combining and operating appropriate chip subsystems (transmitters, receivers, etc.). These transceivers are not only cost effective but also exhibit substantial capabilities in providing desirable transmitted signal waveforms, reducing receiver conversion losses, achieving low noise figures, allowing frequency selection flexibility, achieving low power and providing external control voltage $V_{TUNING}$ in a range of bandwidths extending beyond 8 GHz.

FIGS. 1a, 1b, and 1c show partial, mixed schematic and block diagrams of the radio frequencies transceivers that are fabricated in monolithic integrated circuit chips. These transceiver diagrams generally have a voltage controlled oscillator section (A), a power divider section (B), a driver amplifier section (C), and a receive section (D1) on the receiver side of the chip and a transmit section (D2) on the transmitter side of the chip with FIG. 1b also having an intervening multiplier section (D) therein ahead of a receive section (E) and a transmit section (F). The curved lines in these figures represent electrically conductive "jumper" circuit interconnections affixed to the chip pads between which they extend.

The layouts of the circuits of the transceivers represented in these diagrams as they have been formed in monolithic integrated circuit chips are correspondingly shown in FIGS. 2a, 2b, and 2c. These transceiver monolithic integrated circuits were fabricated on GaAs substrates 100 µm thick with a dielectric constant of 12.9 but can be alternatively fabricated on InP, SiGe, GaN, or other suitable semiconductor material substrates to form the integrated circuit chips, and with these substrates having their other major surface, opposite the layout surface of these chips shown in these figures, metallized with gold and grounded during operation of the circuits. These metallized surfaces serve as the overall ground plane (24) for these chips in a microstrip transmission line or waveguide configuration. Alternatively, these transceiver monolithic integrated circuits can be fabricated in a coplanar (ground plane on layout side of chip) transmission line or waveguide configuration. The transmission lines metallizations were of gold about 2 µm thick.

The voltage controlled oscillator section (A) of the transceiver chips has two series stages with the first stage being a 0.15 µm channel length, 400 µm gate width oscillator FET (11) of the PHEMT/HEMT kind using a feedback configuration thereamong comprising a series of differing couplings in the feedback path, and followed at the output thereof by a second stage buffer amplifier (14) based on a FET of the PHEMT/HEMT kind with the same gate length and width as the first. All the other FETs in the chips described herein are also of the PHEMT/HEMT kind with the same gate length as these but the gate widths differ to thereby be suitable for the particular circuits in which they appear. This oscillator section of the transceiver chip operates as explained in the U.S. Pat. No. 7,068,115 titled "Monolithic Microwave Integrated Circuit Voltage Controlled Coupled Feedback Oscillator" which is hereby incorporated herein by reference. In addition, the voltage controlled oscillator can be tuned to provide two signals (one at half the frequency of other) as well as being tuned by an external voltage source over a frequency range of greater than 4 GHz of bandwidth. There are also alternatives useable for the oscillator section including a Dielectric Resonator Oscillator (DRO), Phase Lock Loop Oscillator (PLL) and Injection Lock Oscillator (ILO).

Air bridges based tuning stubs and couplers further allow gross and fine mechanical tuning for over 10 GHz of bandwidth (i.e., 24 to 34 GHz) to provide the primary oscillator output frequency $F_0$ Combined with a selected bias configuration, a further output frequency equal to ½ $F_0$, can be generated simultaneously with the main frequency $F_0$. A tuning stub with an air-bridge on the input of the buffer amplifier also allows for oscillator section VSWR matching versus frequency with the succeeding section.

That next section is a power divider section (B) to which oscillator buffer amplifier (11) is capacitively coupled by a blocking capacitor 15 to prevent low frequency currents in the amplifier from flowing into the divider, this divider being a 3 dB Wilkinson power divider (16). A 50Ω thin-film resistor is fabricated monolithically to provide this device. The power divider distributes the output signal of frequency $F_0$, or signals with the frequencies of $F_0$+½ $F_0$, of the oscillator section equally to the receiver and transmit sections succeeding the divider section as a local oscillator signal in sync at each of these further sections. The power divider has a bandwidth of more than 5 GHz at both $F_0$ and ½ $F_0$.

The driver amplifier section (C) comprises a pair of independent medium power driver amplifiers (17), one of them coupling one of the outputs of power divider (16) through a low frequency current blocking capacitor (15) to the succeeding transmit section and the other coupling the other of the outputs of the power divider through a low frequency current blocking capacitor (15) to the succeeding receive section of the transceiver. The purpose of each of the driver amplifiers is to boost the oscillator based signal or signals magnitude or magnitudes before they reach the corresponding one of the succeeding multiplier/mixer/amplifier circuits in each of the receive and transmit sections of the transceiver. Each of these driver amplifiers (17) in the driver amplification section has two amplification stages therein, the first stage based on a FET with a gate width of 150 µm, and the succeeding second stage based on a FET with a gate width of 300 µm. The device operating voltage biasing is provided so that these FETs are operated in their linear operating region. Both the stages are impedance matched well to the corresponding power divider outputs, and to the corresponding following multiplier/mixer/amplifier sections inputs, to thereby achieve high gain and medium to high power output. That is, the input and output of each driver amplifier in each driver amplifier section is preceded by, and followed by (a single common tuning stub between the two amplification stages in each of the two amplifiers in the section), a corresponding tuning stub, respectively, with air-bridges therein to allow adjusting the tuning length thereof to achieve the best VSWR matching in the desired frequency range as can be seen in the circuit schematic diagram of FIG. 4.

The multiplier/mixer/amplifier circuits in receive sections D1 and D/E, and in transmit sections D2 and D/F, of the transceivers are based on one or more FETs therein serving as a) frequency multipliers insofar as providing an output signal of a frequency that is a selected harmonic of the input driver amplifier signal, which oscillates at the oscillator primary frequency $F_0$, in a range of available harmonics therefrom, i.e., one selected from the range of $F_0$ to 8 $F_0$ by suitably choosing the drain current value through that FET, or b) mixers insofar as providing an output signal of a frequency that is a selected harmonic of the input driver amplifier signal, which oscillates at the oscillator primary frequency $F_0$, in a range of available harmonics, i.e., one selected from the range of $F_0$ to 8 $F_0$ by suitably choosing the drain current value through that FET, as resulting from that harmonic being multiplied by a further incoming modulating signal also supplied to that FET at port (18). The FETs directly used in providing such signal multiplier or signal mixer capabilities resulting in the output signals provided thereby are typically followed by a further FET serving as a buffer amplifier amplifying those output signals. Such multiplier/mixer/amplifier circuits are modified versions of the circuits described in U.S. Pat. No. 6,208,214 titled "Multifunction High Frequency Integrated Circuit Structure" based on a negative resistance formed by a FET using a suitable source impedance arrangement from which arrangement harmonics of input signals can be obtained, this patent hereby being incorporated herein by reference.

Multipliers for multiplying the frequency of the amplified, voltage controlled oscillator signal portion supplied thereto from the driver amplifiers section by 1 to 8 times (that is, selecting the desired corresponding harmonic of $F_0$ developed by the corresponding FET serving as a negative resistance through selecting the drain current therethrough) are shown by a) FET 11 as the direct multiplier stage for signals from the driver amplifier capacitively coupled thereto, and followed by FET 21 as a buffer amplifier in transmit section D2 of FIG. 1a, by b) FETs 11 as the direct multiplier stages for signals from the corresponding driver amplifier capacitively coupled thereto, and each followed by a corresponding FET 21 as buffer amplifier stages in multiplier section D shown inserted between the driver amplifiers section C and both receive section (E) and transmit section (F) of FIG. 1b, and in some instances by c) FET 11 as the direct multiplier stage for signals from the driver amplifier capacitively coupled thereto, and followed by FET 21 as a buffer amplifier in transmit section D2 of FIG. 1c, such instances depending on whether $IF_{IN}$, is provided at port (28) or not. (An alternative demonstrating system versatility, when an IF (or RF) signal is provided into the signal input into FIG. 1b port (18, 28), FET (11) can operate as a subharmonic mixer thereby mixing the input signal with the LO signal to produce either a TX Out or IF Out.)

Corresponding tuning stubs with air-bridges are provided at the input and the output of each multiplier again to allow plucking of the air-bridges to adjust the multiplier (or mixer) to minimize conversion loss, and to obtain the desired good frequency performance matching and good VSWR match over frequency with the preceding driver amplifier section output and capacitor coupler, and with the succeeding amplifier and directional coupler input. Similarly, a tuning stub with air-bridges is provided at the output of the buffer amplifier. The multiplier self bias circuit arrangement is shown in the circuit schematic diagram of FIG. 3 and the multiplier buffer amplifiers circuits are shown in the circuit schematic diagrams of FIG. 5. The ½ $F_0$, driver amplifier signal out, $IF_{IN}$ supplied signal in, port (27/28) in FIG. 1c also serves as a local oscillator (LO) monitor (27) for the signal of frequency ½ $F_0$ at the circuit point just before the sometimes multiplier, sometimes mixer operation of FET 11 of transmit section D2.

Mixers receive the amplified, voltage controlled oscillator signal supplied thereto from the driver amplifiers section, or the frequency multiple of the amplified, voltage controlled oscillator signal supplied thereto from a multiplier, and then multiply its frequency by 1 to 8 times (that is, selecting the desired corresponding harmonic of $F_0$ developed by the corresponding FET serving as a negative resistance through selecting the drain current therethrough) to provide the mixer local oscillator signal LO. That LO signal has its magnitude multiplied by that of a corresponding incoming modulating signal, supplied to that FET from an external source, to yield, among other signals, an intermediate frequency output signal having a frequency in the range of 0 to 4 GHz. Such mixers are shown by a) FET 11 in receive section D1 of FIG. 1a as the direct mixer stage for signals from (i) port (18) and from (ii) the driver amplifier capacitively coupled thereto through a further directional coupler, and followed by FET 20 as a buffer amplifier, by b) FETs 32 in receive section E of FIG. 1b as balanced mixers for signals coupled thereto from (i) the corresponding multiplier through a directional coupler (12), a buffer amplifier (21), a Lange coupler (30) and matching circuits (31), and from (ii) port (18) through a Lange coupler (30) and matching circuits (33), and in some instances by (c) FET 11 in transmit section D2 of FIG. 1c as the direct mixer stage for signals from (i) port (28) and from (ii) the driver amplifier capacitively coupled thereto, and followed by FET 21 as a buffer amplifier, such instances depending on whether $IF_{IN}$ is provided at port (28) or not.

These mixers come in two versions, a subharmonically pumped mixer in each of FIGS. 1a and 1c in which the incoming signal from the driver amplifier at frequency $F_0$ has a selected harmonic thereof multiplied by the incoming modulating signal, and a fundamental mixer in FIG. 1b in which the incoming signal from the multiplier at a selected harmonic of $F_0$ is multiplied by the incoming modulating signal at the same frequency. These subharmonic mixers each have FET 11 formed with a 300 μm wide gate as the direct mixer stage followed, through a blocking capacitor 15, by 150 μm gate width FET 20 as a buffer amplifier stage, and achieve a <6 dB conversion loss for the transceiver transmit sections output signals Tx and about a 15 dB conversion loss for the receive sections incoming modulation signals Rx. Blocking capacitor 15 is provided as before to block low frequency electrical currents in the mixer stage flowing into the buffer amplifier stage, however, they can be shorted if not needed in some circumstances.

The mixer self bias circuit arrangement is also shown in the circuit schematic diagram of FIG. 3 and the mixer buffer amplifiers circuits are again shown in the circuit schematic diagrams of FIG. 5. Corresponding tuning stubs with air-bridges are provided at the input and the output of each subharmonic mixer also to allow plucking of the air-bridges to adjust the multiplier to minimize conversion loss, and to obtain the desired good frequency performance matching and good VSWR match over frequency with the preceding driver amplifier section output and the capacitor and directional couplers, and with the succeeding amplifier and capacitor coupler input. Similarly, a tuning stub with air-bridges is provided at the output of the buffer amplifier.

The fundamental mixer uses a balanced FET mixer topology typically operating in the frequency range of 50 to 75 GHz. The two balanced mixers are each provided by a single stage 100 μm gate width common source connected FET device (32). The transistors are well matched at their inputs and outputs for good VSWR matching, and also to filter out the unnecessary harmonics in the operation of the mixer. Each transistor is biased to operate in a nonlinear operating region. The local oscillator (LO) signal from the prior multiplier in section (D) coupled thereto is applied to the gates of both FET mixers through a Lange coupler (30) and matching circuits (31). Bias voltage is supplied through decoupling networks (2) to bias the gate, and to optionally bias the drain for higher conversion gain but that requires accepting higher LO leakage. The Rx in signal port (18) is coupled to the drains of the mixers through another Lange coupler (30) and matching circuits (33), and which drains are also connected together by the Lange coupler. This mixer provides good isolation between the Rx in signal port (18) and the IF Out signal port (22). Matching circuits (31) and (32), which again include tuning stubs typically having air bridges therein and also include widened transmission line sections serving as quarter-wave transformers, together with the Lange couplers (30) are used to provide good VWSR matching over frequency with the preceding multiplier connected thereto and with the input port arrangement.

Thus, the different sections of the transceivers form a fully monolithically integrated transceiver on GaAs or InP, SiGe, GaN, or other semiconductor material, substrates. This has been achieved by carefully matching all the chip sections to a 50Ω characteristic impedance at the inputs and outputs thereof through adjusting the lengths of the microstrip transmission line tuning stubs to obtain maximum VSWRs and good matching over frequency in interconnecting the circuit sections, minimum signals attenuation, and symmetrical lengths for the side-by-side transmit and receive sections with the signal ports at the outer edges of those sections for convenient use. This adjusting was aided by isolating many of the sections from adjacent ones so as prevent low frequency current components in one section from interfering with the operation of the section or sections adjacent thereto.

In providing such matched circuit sections, the entire transceiver monolithic chip is operated using one power supply for the FET drains, one power supply for the FET gates, and one tuning voltage supply. No external bias circuitry is required primarily due to the use of self-bias arrangements for most of the chip FETs based on using resistors of different values between the FET gates and ground from the values used for the resistors connected between the FET sources and ground as shown in the schematic diagram of FIG. 3. This allows the FET gates to be at a lower potential difference with respect to the ground plane than are the sources. Also, monolithic thin-film resistors are provided in parallel networks (4a) between the FET drain directly supplied a power supply voltage and other drains to thereby supply adjustable value voltages to various sections of the chip. The parallel resistor networks are formed using air bridges which can be plucked to adjust the value of power supply voltage supplied to the other FETs of the transceiver. In addition to these resistor networks in the voltage supply lines, there are also islands of resistor networks (4b) that are provided monolithically to be used for bias purposes to allow any section of the transceiver circuit to be provided with alternative values of voltage biasing in supplying the required voltages to the driver amplifier and buffer amplifier as shown in the schematic circuit diagrams of FIGS. 4 and 5, respectively.

Thus, the transceiver can be tuned to different frequency ranges through being provided with different bias conditions therein to allow providing different circuit capabilities and to exercise those capabilities at alternative frequencies. By inserting a radio signal into the input port (18 or 28), the chip can convert to superheterodyne operation of mixing the input signal with the LO signal for higher frequency signal output (or upconverting) or mixing with the LO signal for lower frequency signal output (or downconverting). The up or down conversion is determined by the input signal frequency and drain bias condition on FET (11) to select the desired output frequency. FIG. 6a shows a graph plotting test results of the single chip transceiver of FIG. 2c with the transmit section multiplying the LO signal to different frequencies 26 GHz, 60 GHz and 77 GHz and the Receive section at 60 GHz. FIG. 6b shows a graph plotting test results of the same single chip transceiver of FIG. 2c having input signals mixing with the LO to produce transmissions at 60 GHz and 94 GHz outputs. Frequency tuning can also be done by plucking air-bridges (26) to allow the transceiver to be optimized for operational bandwidths in excess of 8 GHz centered on frequencies selected anywhere between 11 GHz to 100 GHz. Air-bridges are also provided to aid in configuring the chip for differing or alternative capabilities such as providing an oscillator, a mixer, a multiplier, a power divider, etc.

As shown in FIGS. 2a, 2b and 2c, the transceiver chip can be reconfigured to serve as a transceiver, a dual or single transmitter, a dual or single receiver, in whole or part, as well as a dual or single chip multiplier, a voltage controlled oscillator, a mixer, an amplifier or a divider, by cutting the chip interconnections through the air-bridges in front or behind the bonding/test pads (25), or by removing or adding a section through bonding a jumper wire between appropriate bonding pads on the chip. Bonding pads can also be used as locations to check the performance of each section as well as to disable any section then later reinstate that section through adding a wire bond. Any circuit section of the transceiver chip can be completely disconnected from the integrated configuration on that chip and can be used separately. The bias conditions can be altered by adjusting the resistance provided between different sections of the chip. The air bridges provided in the monolithic parallel resistor networks located between different circuit sections of the chip can be used to achieve this.

The following listing is provided for the components corresponding to the numerical designations in the drawings as:

(1) $V_{TUNING}$
(2) De-coupling Networks
(3) $V_{DRAIN}$
(4a) Parallel resistor Network, for intenter-chip biasing
(4b) Islands of resistors
(5) Source resistor for self-biasing
(6) L=inductor
(7) Via-hole to ground
(8) Varactor diode
(9) Quarter-wave microstrip line
(10) Quarter-wave microstrip line
(11) FET
(12) Strip line coupler
(13) $V_{GATE}$
(14) Buffer Amplifier
(15) Blocking capacitor
(16) Wilkinson Power divider
(17) Driver Amplifer
(18) RF port
(19) High value resistor for self-biasing
(20) Buffer amplifier in the Mixer section
(21) Buffer amplifier in the transmit section
(22) IF Out Port
(23) Tx Out Port
(24) Ground
(25) Test pads with doubler air bridges
(26) Tuning air bridges
(27) LO signal monitor
(28) $IF_{IN}$ port
(29) Jumper or wire bonds
(30) Lange Coupler
(31) Input matching circuit
(32) 2×50 μm HEMT FETs
(33) Output Matching Circuit
(34) Fundamental Amplifier Although the present invention has been described with reference to preferred embodiments, workers skilled in the art will recognize that changes may be made in form and detail without departing from the spirit and scope of the invention.

What is claimed is:

1. A transceiver device having a plurality of operational modes, the transceiver device formed with an integrated circuit, the transceiver device having a transmit signal output, a receive signal input and an intermediate frequency output, the transceiver device comprising:

a semiconductor material substrate having a conductive ground plane on an equipotential major surface thereof on a side opposite an operating major surface thereof;

a feedback oscillator supported on said substrate at said operating major surface having an output with an output impedance and formed from an amplifier having a directional coupler in a feedback arrangement between said feedback oscillator output and an input of said feedback oscillator;

a signal power divider supported on said substrate at said operating major surface having an input with an input impedance that is electrically coupled to said feedback oscillator output and having a first divider output and a second divider output each with an output impedance;

a first active operational unit supported on said substrate at said operating major surface having an input with an input impedance that is electrically coupled to receive a first signal derived from the first divider output of said signal power divider, wherein the first active operational unit generates a signal at the transmit signal output; and a second active operational unit comprising a signal mixer supported on said substrate at said operating major surface having a first input and a second input each with an input impedance of which the first input is electrically coupled to receive a second signal derived from the second divider output of said signal power divider, and the second input is configured to receive a signal from the receive signal input, and wherein the second active operational unit is operative to generate the intermediate-frequency output based on mixing the signals coupled to its first input and second input, wherein the signal power divider further includes a first buffer amplifier coupled to receive the first divider output and to generate a first amplified divider output and a second buffer amplifier coupled to receive the second divider output and to generate a second amplified divider output, the first active operational unit comprising a transmit output amplifier that amplifies the signal to be transmitted, and a first frequency multiplier operatively coupled between the first amplified divider output of the signal power divider and the transmit output amplifier and functioning to generate the signal derived from the first amplified output of the signal power divider that includes a selected harmonic multiple of the frequency of oscillation of the feedback oscillator, the transmit output amplifier operable to amplify the selected harmonic multiple of the frequency of oscillation of the feedback oscillator as the signal to be transmitted, wherein a common drain voltage is used for the feedback oscillator, the first active operational unit, and the second active operational unit, and wherein the transceiver device includes a plurality of selectable resistances to select different voltages for different transistors.

2. The transceiver device of claim 1, wherein the feedback oscillator includes an electrically controlled variable-impedance device operatively coupled to control a frequency of oscillation of the feedback oscillator, and wherein the transceiver device includes an electrical input coupled to the electrically controlled variable-impedance device.

3. The transceiver device of claim 1, further comprising:
a first frequency multiplier operatively coupled between the first output of the signal power divider and the first active operational unit and functioning to generate the signal derived from the first amplified output of the signal power divider that includes a selected harmonic multiple of the frequency of oscillation of the feedback oscillator, the first active operational unit comprising an amplifier that amplifies the selected harmonic multiple of the frequency of oscillation of the feedback oscillator as the signal to be transmitted; and
a second frequency multiplier operatively coupled between the second output of the signal power divider and the second active operational unit and functioning to generate the signal derived from the second amplified output of the signal power divider that includes the selected harmonic multiple of the frequency of oscillation of the feedback oscillator, the second active operational unit generating an intermediate-frequency signal having information from the received signal.

4. The transceiver device of claim 1, further comprising:
a first frequency multiplier operatively coupled between the first output of the signal power divider and the first active operational unit and functioning to generate the signal derived from the first amplified output of the signal power divider that includes a selected harmonic multiple of the frequency of oscillation of the feedback oscillator, the first active operational unit comprising a mixer that modulates the selected harmonic multiple of the frequency of oscillation with in input intermediate-frequency signal and an amplifier that amplifies the modulated selected harmonic multiple of the frequency of oscillation of the feedback oscillator as the signal to be transmitted.

5. The transceiver device of claim 1, wherein the first active operational unit comprises an output amplifier that amplifies the signal to be transmitted.

6. The transceiver device of claim 1, wherein each of the input impedances and output impedances are matched to a characteristic impedance value by adjustable microstrip transmission-line lengths.

7. A transceiver device having a plurality of operational modes, the transceiver device formed with an integrated circuit, the transceiver device having a transmit signal output, a receive signal input and an intermediate frequency output, the transceiver device comprising:

a semiconductor material substrate having a conductive ground plane on an equipotential major surface thereof on a side opposite an operating major surface thereof;
a feedback oscillator supported on said substrate at said operating major surface having an output with an output impedance and formed from an amplifier having a directional coupler in a feedback arrangement between said feedback oscillator output and an input of said feedback oscillator;
a signal power divider supported on said substrate at said operating major surface having an input with an input impedance that is electrically coupled to said feedback oscillator output and having a first divider output and a second divider output each with an output impedance;
a first active operational unit supported on said substrate at said operating major surface having an input with an input impedance that is electrically coupled to receive a first signal derived from the first divider output of said signal power divider, wherein the first active operational unit generates a signal at the transmit signal output; and
a second active operational unit comprising a signal mixer supported on said substrate at said operating major surface having a first input and a second input each with an input impedance of which the first input is electrically coupled to receive a second signal derived from the second divider output of said signal power divider, and the second input is configured to receive a signal from the receive signal input, and wherein the second active operational unit is operative to generate the intermediate-frequency output based on mixing the signals coupled to its first input and second input, wherein the signal power divider further includes a first buffer amplifier coupled to receive the first divider output and to generate a first amplified divider output and a second buffer amplifier coupled to receive the second divider output and to generate a second amplified divider output, the first active operational unit comprising a transmit output amplifier that amplifies the signal to be transmitted, and a first frequency multiplier operatively coupled between the first amplified divider output of the signal power divider and the transmit output amplifier and functioning to generate the signal derived from the first amplified output of the signal power divider that includes a selected harmonic multiple of the frequency of oscillation of the feedback oscillator, the transmit output amplifier operable to amplify the selected harmonic multiple of the frequency of oscillation of the feedback oscillator as the signal to be transmitted, wherein the selected harmonic multiple is selectable to be an integer between 1 and 8 inclusive by adjusting a drain current of a FET.

8. The transceiver device of claim 7, wherein the feedback oscillator includes an electrically controlled variable-impedance device operatively coupled to control a frequency of oscillation of the feedback oscillator, and wherein the transceiver device includes an electrical input coupled to the electrically controlled variable-impedance device.

9. The transceiver device of claim 7, further comprising:
a first frequency multiplier operatively coupled between the first output of the signal power divider and the first active operational unit and functioning to generate the signal derived from the first amplified output of the signal power divider that includes a selected harmonic multiple of the frequency of oscillation of the feedback oscillator, the first active operational unit comprising an amplifier that amplifies the selected harmonic multiple of the frequency of oscillation of the feedback oscillator as the signal to be transmitted; and a second frequency multiplier operatively coupled between the second output of the signal power divider and the second active operational unit and functioning to generate the signal derived from the second amplified output of the signal power divider that includes the selected harmonic multiple of the frequency of oscillation of the feedback oscillator, the second active operational unit generating an intermediate-frequency signal having information from the received signal.

10. The transceiver device of claim 7, further comprising:
a first frequency multiplier operatively coupled between the first output of the signal power divider and the first active operational unit and functioning to generate the signal derived from the first amplified output of the signal power divider that includes a selected harmonic multiple of the frequency of oscillation of the feedback oscillator, the first active operational unit comprising a mixer that modulates the selected harmonic multiple of the frequency of oscillation with in input intermediate-frequency signal and an amplifier that amplifies the modulated selected harmonic multiple of the frequency of oscillation of the feedback oscillator as the signal to be transmitted.

11. The transceiver device of claim 7, wherein the first active operational unit comprises an output amplifier that amplifies the signal to be transmitted.

12. The transceiver device of claim 7, wherein each of the input impedances and output impedances are matched to a characteristic impedance value by adjustable microstrip transmission-line lengths.

13. A method of operating a transceiver device having a plurality of operational modes, the transceiver device formed as an integrated circuit on a single substrate having a backside conductive ground plane, the method comprising:
generating an internal oscillating signal by amplifying a feedback signal directionally coupled between an output of a feedback oscillator formed on the substrate and an input of said feedback oscillator;
dividing the oscillating signal in the integrated circuit to a first divided signal and a second divided signal each with an output impedance by using a signal power divider on said substrate, wherein the signal power divider has an input with an input impedance that is electrically coupled to said output of said feedback oscillator, and wherein the signal power divider further includes a first buffer amplifier;
generating a transmit signal to be transmitted in the integrated circuit by amplifying a first signal derived from the first divided signal;
receiving a receive input signal in the integrated circuit;
generating an intermediate frequency output signal in the integrated circuit by mixing a second signal derived from the second divided signal and the received input signal;
amplifying the first divided signal and generating a first amplified divided signal;
amplifying the second divided signal and generating a second amplified divided signal;
amplifying the signal to be transmitted;
frequency multiplying the first amplified divided signal, and generating a signal derived from the first amplified divided signal that includes a selected harmonic multiple of the frequency of oscillation of the feedback oscillator, wherein the amplifying of the first signal derived from the first divided signal includes amplifying the selected harmonic multiple of the frequency of oscillation of the feedback oscillator as the signal to be transmitted, wherein the integrated circuit includes a plurality of selectable resistances, and a plurality of transistors including at least one transistor in each of the feedback oscillator, a first active operational unit, and a second active operational unit;

using a common $V_{DRAIN}$ supply voltage to the integrated circuit for the feedback oscillator, the first active operational unit, and the second active operational unit; and connecting at least one of the plurality of selectable resistances to the common $V_{DRAIN}$ in order to provide a plurality of different operating voltages, such that at least two of the plurality of transistors operate at different voltages.

14. The method of operating a transceiver device of claim 13, wherein the feedback oscillator includes an electrically controlled variable-impedance device, the method further comprising:
operatively coupling the electrically controlled variable-impedance device to control a frequency of oscillation of the feedback oscillator, wherein the generating of the internal oscillating signal includes coupling an electrical input to the electrically controlled variable-impedance device.

15. The method of operating a transceiver device of claim 13, further comprising:
frequency multiplying the first divided signal and generating the signal derived from the first amplified divided signal that includes a selected harmonic multiple of the frequency of oscillation of the feedback oscillator, and amplifying the selected harmonic multiple of the frequency of oscillation of the feedback oscillator as the signal to be transmitted; and
frequency multiplying the second divided signal and generating the signal derived from the second amplified divided signal that includes the selected harmonic multiple of the frequency of oscillation of the feedback oscillator, and wherein the mixing includes generating an intermediate-frequency signal having information from the received signal.

16. The method of operating a transceiver device of claim 13, further comprising:
frequency multiplying the first divided signal and generating the signal derived from the first amplified divided signal that includes a selected harmonic multiple of the frequency of oscillation of the feedback oscillator, wherein the mixing modulates the selected harmonic multiple of the frequency of oscillation with in input intermediate-frequency signal and amplifying the modulated selected harmonic multiple of the frequency of oscillation of the feedback oscillator as the signal to be transmitted.

17. The method of operating a transceiver device of claim 13, further comprising matching each of the input impedances and output impedances to a characteristic impedance value by adjusting microstrip transmission-line lengths.

18. A method of operating a transceiver device having a plurality of operational modes, the transceiver device formed as an integrated circuit on a single substrate having a backside conductive ground plane, the method comprising:
generating an internal oscillating signal by amplifying a feedback signal directionally coupled between an output of a feedback oscillator formed on the substrate and an input of said feedback oscillator;

dividing the oscillating signal in the integrated circuit to a first divided signal and a second divided signal each with an output impedance by using a signal power divider on said substrate, the signal power divider having an input with an input impedance that is electrically coupled to said output of said feedback oscillator;

generating a transmit signal to be transmitted in the integrated circuit by amplifying a first signal derived from the first divided signal;

receiving a receive input signal in the integrated circuit; and generating an intermediate frequency output signal in the integrated circuit by mixing a second signal derived from the second divided signal and the received input signal, wherein the signal power divider further includes a first buffer amplifier, the method further comprising:

amplifying the first divided signal and generating a first amplified divided signal; and amplifying the second divided signal and generating a second amplified divided signal, further comprising:

amplifying the signal to be transmitted; and frequency multiplying the first amplified divided signal, and generating a signal derived from the first amplified divided signal that includes a selected harmonic multiple of the frequency of oscillation of the feedback oscillator, wherein the amplifying of the first signal derived from the first divided signal includes amplifying the selected harmonic multiple of the frequency of oscillation of the feedback oscillator as the signal to be transmitted, further comprising selecting the selected harmonic multiple to be an integer between 1 and 8 inclusive by adjusting a drain current of a FET.

19. The method of operating a transceiver device of claim 18, wherein the feedback oscillator includes an electrically controlled variable-impedance device, the method further comprising:

operatively coupling the electrically controlled variable-impedance device to control a frequency of oscillation of the feedback oscillator, wherein the generating of the internal oscillating signal includes coupling an electrical input to the electrically controlled variable-impedance device.

20. The method of operating a transceiver device of claim 18, further comprising:

frequency multiplying the first divided signal and generating the signal derived from the first amplified divided signal that includes a selected harmonic multiple of the frequency of oscillation of the feedback oscillator, and amplifying the selected harmonic multiple of the frequency of oscillation of the feedback oscillator as the signal to be transmitted; and frequency multiplying the second divided signal and generating the signal derived from the second amplified divided signal that includes the selected harmonic multiple of the frequency of oscillation of the feedback oscillator, and wherein the mixing includes generating an intermediate-frequency signal having information from the received signal.

* * * * *